Figure 1:
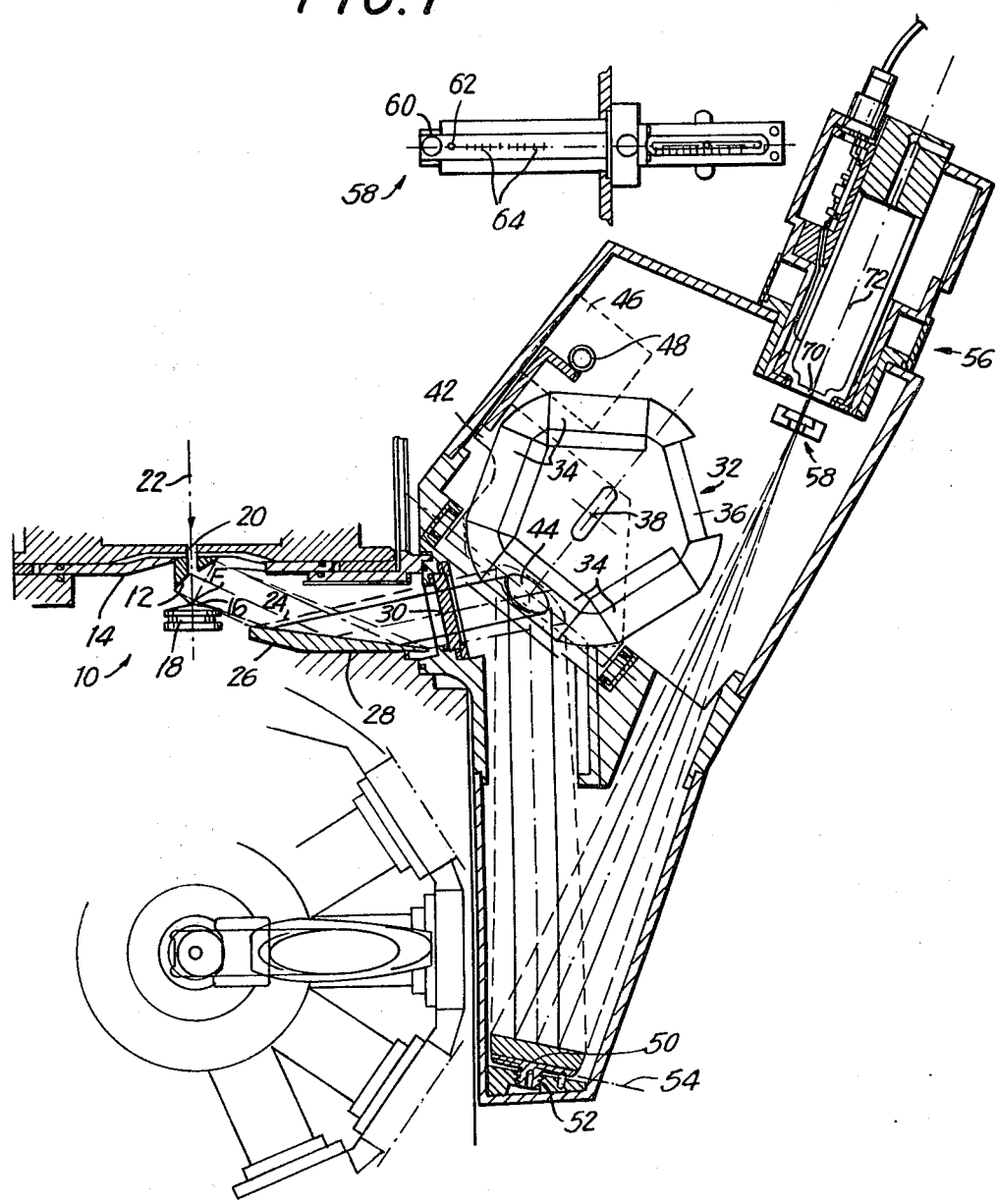

United States Patent [19]

Beauvineau et al.

[11] 4,410,272
[45] Oct. 18, 1983

[54] OPTICAL SPECTROSCOPE FOR SCANNING ELECTRON MICROSCOPE

[76] Inventors: Jacky Beauvineau, 18, rue des Arts et Métiers, 60140 Liancourt; Jack Semo, 3, Résidence des Trois Forêts, 78380 Bougival, both of France

[21] Appl. No.: 272,781

[22] Filed: Jun. 11, 1981

[30] Foreign Application Priority Data

Jun. 19, 1980 [FR] France ................... 80 13619

[51] Int. Cl.³ .................... G01J 3/18; G01N 21/62
[52] U.S. Cl. .................... 356/311; 356/334; 250/310
[58] Field of Search ........... 356/300, 311, 317, 318, 356/334, 328; 250/310, 311

[56] References Cited

U.S. PATENT DOCUMENTS 3,659,945  5/1972  Roche et al. ................... 356/334
3,775,620 11/1973  Meier ............................. 356/334

FOREIGN PATENT DOCUMENTS 2245937  4/1975  France ........................... 356/311

OTHER PUBLICATIONS

Knisely et al., *Analytical Chemistry*, vol. 41, No. 1, Jan. 1969, pp. 50-53.
Carlsson et al., *Journal of Physics E.*, vol. 7, No. 2 Jan. 1974, pp. 98-100.
Balk et al., Conference: *Scanning Electron Microscopy/1975 (Part I), Proceedings of the Eighth Annual Scanning Electron Microscope Symposium*, IIT Research Institute, Chicago, Illinois, Apr. 7-11,1975, pp. 447-455.
Steyn et al., *Journal of Microscopy*, vol. 107, Pt. 2, Jul 1976, pp. 107-128.

*Primary Examiner*—F. L. Evans
*Attorney, Agent, or Firm*—Michael N. Meller

[57] ABSTRACT

Optical spectroscope for scanning electron microscopes, the latter comprising a vacuum chamber containing a sample holder bombarded by an electron beam.

The microscope chamber contains a concave mirror having an opening, a plane deviating mirror and an exit window for the chamber. Outside the microscope chamber is provided a drum carrying a plurality of flat diffractive gratings, the drum being equipped with a bracket which rotates about an axis controlled by a stepping motor. In addition there are a spherical concave mirror, a slit blocking means and a photodetector.

7 Claims, 2 Drawing Figures

OPTICAL SPECTROSCOPE FOR SCANNING ELECTRON MICROSCOPE

The present invention relates to an optical spectroscope for a scanning electron microscope. It is used in both qualitative and quantitative analysis.

Among modern analysis means the scanning electron microscope occupies a very important position, particularly in the characterization of cathodoluminescent materials.

In this connection optical spectroscopes adapted to scanning electron microscopes have been proposed, which are able to analyse optical radiation ranging from the visible to the near infrared. French Patent Application No. 2 245 937 (EN 73 35044) entitled "Improved Optical Spectroscope for Cathodoluminescence studies in Scanning Electron Microscopy" describes one of these devices.

Although the apparatus of the above patent application is satisfactory in the considered wavelength range it suffers from a limitation regarding the available spectral range and the resolving power.

The object of the present invention is to obviate this disadvantage by proposing an apparatus for which the spectral range is much wider, the sensitivity increased, the resolution improved, the dispersion made linear over the entire range and the utilization facilitated.

According to the invention this objective is achieved by using a particular combination of means (optical, mechanical, etc.) which are better adapted to the requirements of cathodoluminescence measurements than was the case in the prior art.

More specifically the present invention relates to an optical spectroscope for a scanning electron microscope comprising a vacuum chamber in which is located a sample holder bombarded by an electron beam, wherein it comprises:

(A) in the said microscope chamber:
(a) a concave mirror formed by a paraboloid portion facing the sample holder in such a way that its focus is in the vicinity of the impact point of the electron beam on the sample, said mirror having an opening permitting the passage of the beam and being thus able to reflect the radiation from the impact point in the form of a parallel beam,
(b) a plane deviating mirror oriented so as to receive the parallel beam,
(c) an outlet window for the chamber, constituted by a plate with parallel faces and made from a material transparent to the useful optical radiation and which is placed on the path of the beam reflected by the deviating mirror, (B) outside the microscope chamber:
(d) a drum supporting a plurality of flat diffraction gratings having different numbers of lines per unit of length, said drum being rotatable about a first axis in such a way that a random one of the gratings can be disposed in the working position facing the window to receive the optical beam leaving the latter, the drum being integral with a bracket movable about a second axis located in the plane of the grating in the working position and parallel to the lines of said grating, the rotation of the bracket about the second axis being controlled by a stepping motor, (e) a spherical concave mirror with a large focal distance able to receive the beam diffracted by the grating in the working position,
(f) a slit blocking means in the focal plane of the spherical concave mirror,
(g) a photodetector located to the rear of the slit blocking means.

The invention will be described in greater detail hereinafter relative to non-limitative embodiments and with reference to the attached drawings, wherein show:

FIG. 1 the apparatus according to the invention in section and plan view.

Figure 2:
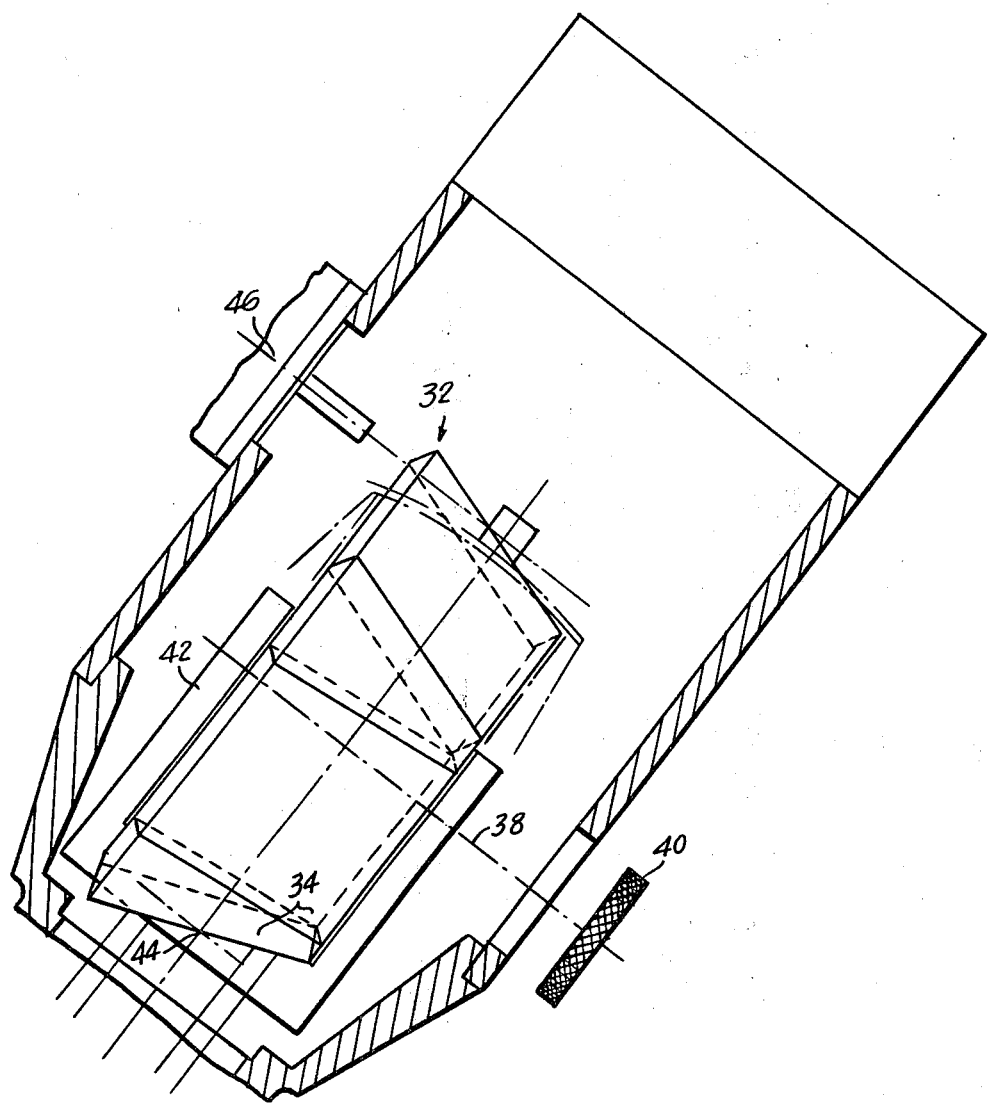

FIG. 2 a plan view of the drum supporting the gratings.

As shown the apparatus comprises at the top a microscope object chamber 10 and a mirror 12, whose reflecting surface is part of a paraboloid of revolution. It is fixed to a flange 14 in such a way that its fitting permits frequent removals and positionings so that it can be decontaminated. Mirror 12 has an opening 20 permitting the passage of an electron beam 22. It has a focus F located in the vicinity of the impact point of electron beam 22 on sample 19, which is fixed to a sample holder 18.

The light emitted by a point of the sample excited by the electron beam is collected by mirror 12 and reflected in the form of a parallel beam 24.

A plane mirror 26, which is integral with a ring 28 permitting its orientation and fixing, reflects the beam 24 outside the microscope enclosure through a plate with parallel faces 30 made from a material ensuring on the one hand the vacuum sealing and on the other the transmission of all the radiation to be detected. It is possible to use fluorine for this purpose.

Outside the microscope chamber there is a drum 32 to which are fixed the diffractive gratings 34 and a plane mirror 36.

In the illustrated embodiment the grating in service is selected from among four gratings having different characteristics chosen so that the working range of the spectroscope extends from 0.2 to 3 $\mu$m. Drum 32 rotates about an axis 38, said rotation being controlled by a knurled knob 40. Plane mirror 36 is used for the vertical positioning of the sample with a good reproducibility in such a way that the electron beam scans the immediate vicinity of focus F of paraboloid 12.

Drum 32 is fixed to a bracket 42, which rotates about an axis 44 passing in the engraved plane of the selected grating parallel to one of the lines thereof. The rotation of the bracket is controlled by a stepping motor 46 and is transmitted by a worm and wheel 48.

The stepping motor 46 may require, for example, 400 pulses per revolution, which are counted and displayed in a control unit, e.g. at a rate of one unit per four motor steps. The worm and wheel ratio is such that for one displayed unit the grating rotates by an angle of 24 seconds, which corresponds to a translation of the diffracted spectrum of 0.9 to 5.6 Å, as a function of the type of grating used.

The electronic control circuit of the motor can have an analog output supplying a voltage which is proportional to the rotation performed. This rotation can be controlled manually and intermittently or continuously and automatically at adjustable speeds.

Inductive stops act on the electronic control circuit of the motor and ensure the security of the maximum displacements of the drum, as well as the start of the count of the motor control pulses (compared with a clearly defined origin).

The beam reflected by mirror 26 strikes the grating 34 in the working position and is then diffracted by the latter towards a concave spherical mirror 40 of focal length 400 mm and aperture 60 mm. An articulated fitting of this mirror to a ball joint 52 makes it possible to effect a very precise orientation by means of screws 54. The rotation of the grating about axis 44 leads to the passage of the spectrum on mirror 50.

The diffracted beam is then reflected and focused by the mirror 50 towards a detection system 56. A calibrated opening slit blocking means 58 is arranged in the focal plane of the mirror. The function of these slits is to only allow the passage to the detector of that part of the beam offering the best compromise between resolution and intensity.

It should be noted that the scanning of the sample by the electron beam displaces the source point about the focus F of the parabolic mirror 12. This scanning leads to a permanent oscillation of the light beam, so that the dimensions of the various optical elements have to be selected so as to ensure the optimum transmission of the signal for a minimum magnification.

The slot blocking means 58 is constituted by two cylindrical openings 60, 62 of respective diameters 10 and 3 mm and a succession of ten parallel slits 64 of length 4 mm and openings between 1 and 0.1 mm. The ten mm opening 60 permits the fitting of a ground glass having the same diameter and makes it possible to visualize the image of the light source, observe the influence of its displacement and to thus regulate the plane containing the slits coinciding with the focal plane of mirror 50. The diameter 3 mm opening 62 essentially serves for the vertical positioning of the sample, as well as for running observations where a maximum detected intensity is desirable.

The radiation from the selected slit then reaches the sensitive surface 70 of a detector 72 chosen as a function of the nature of the analyzed material. For wavelengths between 0.2 and 1.1 μm preference is given to the use of a silicon photodiode with an extensive response in the ultraviolet. Between 1.1 and 1.8 μm preference is given to the use of a germanium diode cooled to 77° K., whilst at between 1.8 and 3 μm preference is given to the use of a photoconductive cell of the PbS or PbSe type.

In summarizing the rotation of the motor modifies the angular position of the grating. The display of the motor indicates the range of wavelengths transmitted to the detector and a manual, intermittent rotation permits the maximum investigation of the detectable signal. Correlation between the display and the selected wavelengths is rapidly brought about by using a suitable table or nomogram.

The automatic continuous rotation of the motor also makes it possible, by means of a plotting table XY, to graphically show the relationship between the voltage supplied by the analog output (position of the motor) and the voltage representing the intensity of the detected signal. In this way it is possible to obtain the cathodoluminescence spectrum of the analyzed sample at particular points marked on the image, when the latter reveals contrast modifications during the rotation of the gratings. The knowledge of the spectrum at a particular point of the sample facilitates the interpretation of the results obtained.

Table I summarizes the differences between the prior art, as described in the aforementioned French Patent Application and the present invention. Table II indicates the advantages provided by the invention for each of the differences appearing in Table I.

TABLE I

| | Prior art | Invention |
|---|---|---|
| (a) optical system | lens | catadioptric |
| (b) dispersive system | 1 prism (fixed) | 4 commutatable (regulatable) gratings |
| (c) spectral range | visible and near IR: 0.46–0.9 | visible and near UV and IR: 0.2–3 |
| (d) signal collection | sight with three achromatized doublets for the visible | large aperture parabolic mirror |
| (e) method of selecting the analyzed wavelength | by displacement of the exit slit in front of the fixed spectrum | by displacement of the spectrum in front of a fixed slit |
| (f) system of focusing on the exit slit | 2 doublets with a short focal length achromatized for the visible | 1 spherical concave mirror with a large focal distance |
| (g) system of slits | one movable slit with a variable aperture | a set of movable slits with calibrated apertures |
| (h) detection | by photomultiplier | by Si photodiode, Ge photodiode (77° K.) or PbS/PbSe photoconductors |
| (i) resolving power of the system | function of the position on the spectrum (decreasing from short to long wavelengths): $\Delta\lambda = 300\text{Å}$ to $9000\text{Å}$ | constant over the entire spectral range of each grating: $\Delta\lambda < 50\text{Å}$ |
| (j) vacuum sealing | molten silica plate with parallel faces | fluorine plate with parallel faces |
| (k) possibility of observation in unfiltered light | by retracting the prism and using a plane mirror | by substituting a plane mirror for the grating |

TABLE II

Advantages provided by the invention (a) Perfect achromatism for the entire spectral range and lower losses by reflection.
(b) Linear dispersion over the entire range and optimization of the diffracted intensity.
(c) Spectral range 6.5 times greater.
(d) Collecting power increased by a factor of >14.
(e) Perfectly linear correspondence between the position of the grating and the detected wavelength.
(f) Better spread of the spectrum in the focal plane of the condenser.
(g) Possibility of interposing ground glass for the control.
(h) Rapid interchangeability of detectors making it possible to cover the complete analyzable range.
(i) Improvement of the resolving power throughout the spectral range.
(j) Better spectral transmission.
(k) Easier marking and manipulation.

We claim:

1. An optical spectroscope for a scanning electron microscope comprising a vacuum chamber in which is located a sample holder bombarded by an electron beam, wherein it comprises:
   (A) in the said microscope chamber:

(a) a concave mirror formed by a paraboloid portion facing the sample holder in such a way that its focus is in the vicinity of the impact point of the electron beam on the sample, said mirror having an opening permitting the passage of the beam and being thus able to reflect the radiation from the impact point in the form of a parallel beam, (b) a plane deviating mirror oriented so as to receive the parallel beam, (c) an outlet window for the chamber, constituted by a plate with parallel faces and made from a material transparent to the useful optical radiation and which is placed on the path of the beam reflected by the deviating mirror, (B) outside the microscope chamber:

(d) a drum supporting a plurality of flat diffraction gratings having different numbers of lines per unit of length, said drum being rotatable about a first axis in such a way that a random one of the gratings can be disposed in the working position facing the window to receive the optical beam leaving the latter, the drum being integral with a bracket movable about a second axis located in the plane of the grating in the working position and parallel to the lines of said grating, the rotation of the bracket about the second axis being controlled by a stepping motor, (e) a spherical concave mirror with a large focal distance able to receive the beam diffracted by the grating in the working position, (f) a slit blocking means in the focal plane of the spherical concave mirror, (g) a photodetector located to the rear of the slit blocking means.

2. A spectroscope according to claim 1, wherein the drum also comprises a plane mirror able to come into the working position in place of a diffractive grating.

3. A spectroscope according to claim 1, wherein the exit window of the chamber is made from fluorine.

4. A spectroscope according to claim 1, wherein the slit blocking means comprises a set of calibrated aperture movable slits.

5. A spectroscope according to claim 1, wherein the stepping motor is controlled by an electronic circuit supplying it with electrical control pulses and wherein means for counting and displaying the number of pulses are provided.

6. A spectroscope according to claim 5, wherein the stepping motor is also provided with manual control means.

7. A spectroscope according to claim 1, wherein the concave mirror is mounted on a system having a ball joint and a control screw.

* * * * *